United States Patent
Engholm et al.

(10) Patent No.: US 6,229,456 B1
(45) Date of Patent: May 8, 2001

(54) METHOD AND APPARATUS FOR FACILITATING USER INTERACTION WITH A MEASUREMENT INSTRUMENT USING A DISPLAY-BASED CONTROL KNOB

(75) Inventors: Kathryn A. Engholm, Beaverton; Larry Joe Huff, Scappoose, both of OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

(21) Appl. No.: 09/131,900

(22) Filed: Aug. 10, 1998

(51) Int. Cl.[7] .................................................. H03K 11/00
(52) U.S. Cl. ............................ 341/35; 341/34; 345/173; 345/974
(58) Field of Search .............................. 341/34, 192, 35; 345/173, 118, 434, 974

(56) References Cited

U.S. PATENT DOCUMENTS 4,649,499  3/1987  Sutton et al. .
5,485,600 * 1/1996  Joseph et al. ........................ 703/13
5,559,301  9/1996  Bryan, Jr. et al. .

OTHER PUBLICATIONS

ToolBox 4.3 OTDR Test Application Software Instruction Manual, Mar. 1997, pp. 25–26.

* cited by examiner

Primary Examiner—Michael Horabik
Assistant Examiner—Timothy Edwards, Jr.
(74) Attorney, Agent, or Firm—Francis I. Gray; Allan T. Sponseller (57) ABSTRACT

A method and apparatus for facilitating user interaction with a measurement instrument displays a control knob glyph corresponding to a user-adjustable parameter of the measurement instrument, the control knob glyph having an indicator and a partially circular drag area through which the indicator can be rotated. Inputs indicating amounts of rotational movement for the indicator can be received, and the location of the indicator within the drag area and the value of the parameter changed in response to such inputs.

17 Claims, 4 Drawing Sheets

METHOD AND APPARATUS FOR FACILITATING USER INTERACTION WITH A MEASUREMENT INSTRUMENT USING A DISPLAY-BASED CONTROL KNOB

BACKGROUND OF THE INVENTION

1. Field of the Invention

The present invention pertains to measurement instruments. More particularly, this invention relates to a measurement instrument display-based control knob.

2. Background

Various measurement instruments are known in the art, such as oscilloscopes, spectrum analyzers, and reflectometers. Measurement instruments include instruments that generate test signals, instruments that merely measure or sample signals, and combinations thereof. Measurement instruments are used in a wide variety of applications, such as measuring engine vibrations, measuring electronic device voltages, measuring brain waves, etc. Historically, measurement instruments are analog devices, however, increasingly measurement systems are constituted with digital components. Furthermore, increasingly graphical user interfaces (GuIs) are being employed to assist users in control and operation of the instruments.

Measurement instruments typically provide a variety of user-controllable parameters in order for a user to "tune" the instrument properly to whatever signal(s) the user is trying to measure and to display the signal(s) in a manner useful to the user. Examples of such parameters include the center frequency of a spectrum analyzer, the vertical position of an oscilloscope trace, etc. Different mechanisms currently exist to allow users to adjust these parameters.

Figures 1A, 1B, 1C, 1D:
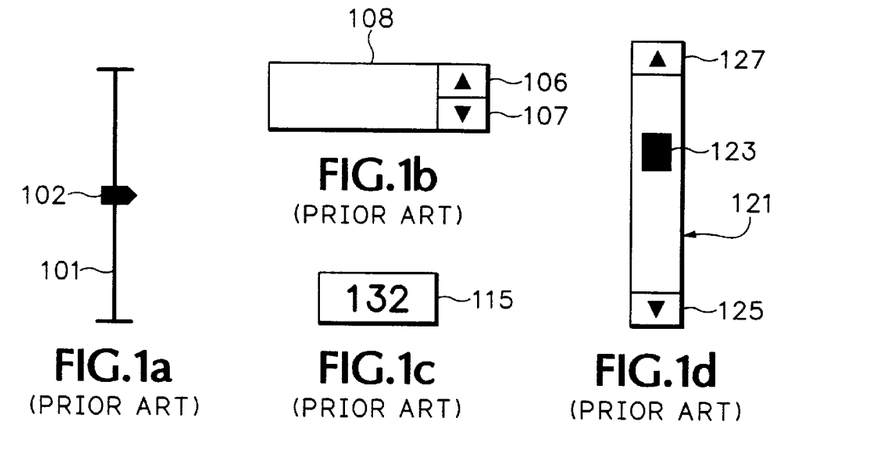
FIGS 1a, 1b, 1c, and 1d illustrate different prior art mechanisms for allowing users to adjust control parameters.

One such mechanism, illustrated in FIG. 1a, is referred to as a "slider". A slider is typically a vertical or horizontal line 101 along which a slide box 102 can be moved by a user. Values are changed by moving the slide box 102 along the line 101 (e.g., "clicking" and "dragging" the box 102 with a pointer). However, one problem with sliders is the inability to make fine adjustments. Rather, the user is limited by how finely he or she can move slide box 102 in a "click and drag" manner, as well as how "sensitivity" parameters for the slider are set up.

Another such mechanism, illustrated in FIG. 1b, are up and down arrows 106 and 107 that allow a user to increment a value 108 by selecting up arrow 106 or decrement the value 108 by selection down arrow 107. Selection of one of the arrows 106 or 107 is typically done by clicking the appropriate arrow with a pointer. However, problems with such arrows include the inability to allow different rates of adjustment (rather, a user is limited to clicking one of the arrows 106 or 107) and the inability to provide graphical feedback of the change in value (rather, only the numeric value is displayed).

Another such mechanism, illustrated in FIG. 1c, is referred to as a "type-in" value. A type-in value box 115 displays a current value for a parameter (the value 132 in the illustrated example). A user can alter the current value by simply entering a new value, such as by typing it on an alphanumeric keyboard. However, problems with type-in values include the inability to provide graphical feedback of the change in value (rather, only the numeric value is displayed), and the inability to provide any GUI-oriented inputs (rather, only typing in a particular value can be done).

Another such mechanism, illustrated in FIG. 1d, is referred to as a "scroll bar". A scroll bar is typically a vertical or horizontal "bar" 121 through which a user can drag a box 123 to alter parameter values. Additionally, values can be incremented by pressing an up arrow 127 or decremented by pressing a down arrow 125.

However, one problem with scroll bars, as well as each of the other mechanisms in FIGS 1a–1c, is that they lack the intuitive clockwise vs. counterclockwise mapping to increasing value vs. decreasing value found in manual control knobs to which people are accustomed. Furthermore, each of the mechanisms illustrated in FIGS 1a–1d lacks the intuitive "stops" or "boundaries" in the clockwise and counterclockwise directions found in manual control knobs.

Thus, an improved parameter adjustment mechanism is needed. As will be discussed in more detail below, the present invention achieves these and other desirable results.

SUMMARY OF THE INVENTION

A method and apparatus for facilitating user interaction with a measurement instrument using a display-based control knob is described herein. A control knob glyph corresponding to a user-adjustable parameter of the measurement instrument is displayed, the control knob glyph having an indicator and a partially circular drag area through which the indicator can be rotated in both a clockwise and a counterclockwise manner. Inputs indicating amounts of rotational movement for the indicator can be received, and the location of the indicator within the drag area and the value of the parameter is changed in response to such inputs.

According to one aspect of the present invention, the control knob glyph also includes increment and decrement buttons. Thus, a user is able to alter the location of the indicator within the partially circular drag area by, for example, dragging the indicator itself, clicking in the drag area, or clicking on one of the increment or decrement buttons. Additionally, the position of the indicator within the drag area corresponds to the value of the user-adjustable parameter of the measurement instrument, both representing its current state and causing user-directed changes to its state.

According to one aspect of the present invention, a measurement apparatus includes a display device and a control subsystem coupled to the display device. The control subsystem provides a control knob glyph on the display device corresponding to a user-adjustable parameter of the measurement apparatus, the control knob glyph having an indicator and a partially circular drag area through which the indicator can be rotated in both a clockwise and a counterclockwise manner. The control subsystem can also receive an input indicating an amount of rotational movement for the indicator and the location of the indicator within the drag area and a value of the parameter is changed in response to the input.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As is well understood by those skilled in the art, these quantities take the form of electrical, magnetic, or optical signals capable of being stored, transferred, combined, and otherwise manipulated through mechanical and electrical components of the computer. system; and the term computer system includes general purpose as well as special purpose data processing machines, systems, and the like, that are standalone, adjunct or embedded.

Additionally, various operations will be described as multiple discrete steps in turn in a manner that is most helpful in understanding the present invention, however, the order of description should not be construed as to imply that these operations are necessarily order dependent, in particular, the order of their presentations.

Figure 2:
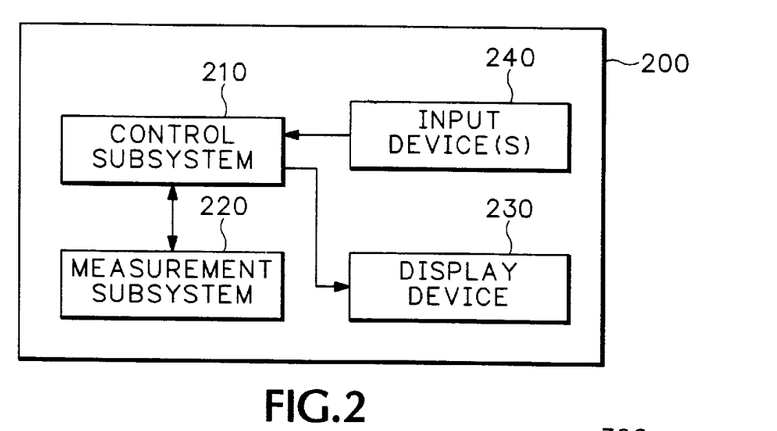
FIG. 2 is a block diagram illustrating a measurement instrument according to one embodiment of the present invention.

FIG. 2 is a block diagram illustrating a measurement instrument according to one embodiment of the present invention. Measurement instrument 200 is intended to represent a wide variety of measurement instruments that display data to a user via a display device. Examples of such measurement instruments include oscilloscopes, spectrum analyzers, reflectometers, etc.

As illustrated in FIG. 2, measurement instrument 200 includes a control subsystem 210, a measurement subsystem 220, a display device 230, and input device(s) 240. Control subsystem 210, operating in conjunction with measurement subsystem 220, display device 230, and input device(s) 240, provides a user interface that allows individuals to input changes to instrument 200 and observe the results of such inputs.

Measurement subsystem 220 provides the control circuitry for the measurement being performed by instrument 200. In the illustrated embodiment, control subsystem 210 manages the interface between users and the measurement subsystem 220. Input data signals are received by subsystem 220 and an output to display device 230, via control subsystem 210, is generated based on the input data signals.

Display device 230 provides feedback to the user of instrument 200. Included in this feedback is both a graphical indication of the signal(s) being measured as well as control settings for measuring those signals. Device 230 can be any of a wide variety of conventional display devices, including cathode ray tube (CRT) monitors, liquid crystal diode (LCD) screens, etc.

Input device(s) 240 allow a user to provide inputs to measurement instrument 200, such as to adjust a control knob glyph provided in accordance with the present invention. Any of a wide variety of conventional input devices can be used as device(s) 240, including cursor control devices (e.g., mouse, arrow keys, trackpad, etc.), touchscreens, etc.

According to one embodiment of the present invention, instrument 200 includes control subsystem 210, measurement subsystem 220, display device 230, and input device(s) 240 within a single enclosure. Alternatively, one or more of subsystem 210, subsystem 220, and device 230 can be implemented as a separate device in a separate enclosure.

Figure 3:
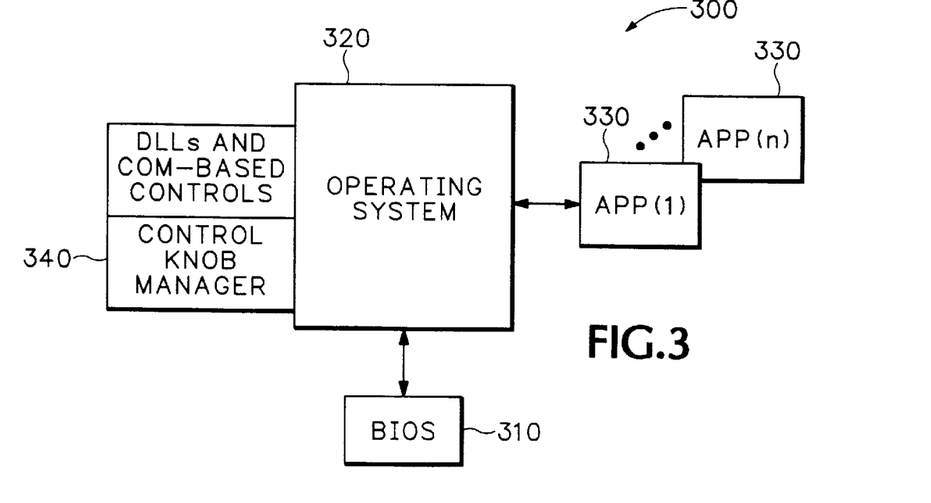
FIG. 3 illustrates a software environment incorporating one embodiment of the present invention.

FIG. 3 illustrates a software environment incorporating one embodiment of the present invention. A software environment 300 is illustrated including a basic input/output system (BIOS) 310, an operating system 320, and multiple (n) applications 330. BIOS 310 provides an interface between operating system 320 and the various input/output (I/O) devices coupled to the system, including display device 230 and measurement subsystem 220 of FIG. 2. The operating system 320 is a software application which manages the execution of applications 330 and provides an interface between BIOS 310 and software applications 330 executing on the system.

According to one embodiment of the present invention, one or more of applications 330 is a "measurement application" that provides software management of measurement subsystem 220 as well as providing information to be presented on display device 230 of FIG. 2. This measurement application(s) provides input mechanisms to allow a user to input values to change both the way in which the data being measured by measurement instrument 200 is displayed by display device 230, as well as what parameters are being used by measurement subsystem 220. One such input mechanism is the control knob glyph of the present invention, as discussed in more detail below. Examples of such parameters include volts/division, center frequency, horizontal position, etc.

In the illustrated embodiment, operating system 320 is a graphical user interface (GUI) operating system, such as Windows™ 95, Windows™ 98, or Windows™ CE, available from Microsoft Corporation of Redmond, Wash. It is to be appreciated, however, that the present invention may be utilized with other conventional operating systems. As is known to those skilled in the art, operating system 320 employs shared software components to provide additional functions to applications 330. These software components can be in the form of dynamic link libraries (DLLs), component object model (COM) based controls such as ActiveX controls (OCXs), etc.

In the illustrated embodiment, an additional OCX including a control knob manager 340 that generates and maintains the control knob glyph of the present invention is also included in environment 300. Providing the control knob manager as a COM based component allows one or more of applications 330 to make use of the manager 340. The use of DLLs and COM based components is well-known to those skilled in the art, and thus will not be discussed further except as it pertains to the present invention. Alternatively, the control knob manager of the present invention can be implemented in the individual applications 330.

Updated values received by control knob manager 340 via user interaction with the control knob glyph are forwarded to the source which initiated control knob manager 340 (e.g., one of applications 330). The source is then able to do whatever it likes with the updated value, such as modifying one of the display settings for display device 230 of FIG. 2, or modifying one of the measurement instrument parameters in measurement subsystem 220.

FIGS. 4*a*–4*e* illustrate various embodiments of the control knob glyph of the present invention. In the illustrated embodiments, the control knob glyph of the present invention is displayed on display device 230 of measurement instrument 200 of FIG. 2. A user can interact with the control knob glyph, thereby changing values for one or more parameters of instrument 200. Interaction with the control knob glyph can be made in any of a wide variety of conventional manners, such as by use of a cursor or pointer and cursor control device (e.g., a mouse or trackpad), or by use of a touchscreen.

Figure 4A:
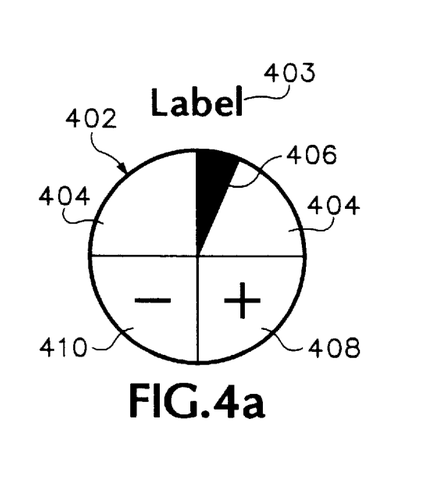
FIGS. 4a, 4b, 4c, 4d, and 4e illustrate various embodiments of the control knob glyph of the present invention.

FIG. 4*a* illustrates a control knob glyph 402 having a drag area 404 through which an indicator 406 having a substantially triangular shaped (or "pie"-shaped) wedge can be moved in a clockwise or counterclockwise manner. The current location of the center of indicator 406 along the circumference of control knob glyph 402 corresponding to drag area 404 identifies the current value of the parameter being represented by control knob glyph 402. Moving indicator 406 in a counterclockwise manner decreases the current value, while moving indicator 406 in a clockwise manner increases the current value.

In the illustrated embodiment of FIG. 4*a*, control knob glyph 402 is separated into two portions which are semicircles. A first portion (the "upper" semicircle) includes drag area 404 and indicator 406, while a second portion (the "lower" semicircle) includes an increment button 408 and a decrement button 410.

A user is able to change the location of indicator 406, and thus the current value of the parameter being represented by knob glyph 402, by interacting with knob glyph 402 in numerous manners. First, a user is able to select and rotate indicator 406 through drag area 404. By way of example, indicator 406 can be selected by pressing down on a mouse button while a cursor or pointer is over indicator 406, or by a user "touching" the indicator with a finger on a touchscreen. The position of indicator 406 can then be changed by dragging the indicator, while the indicator is selected, through drag area 404. Indicator 406 can then be de-selected by releasing the mouse button, or by the user lifting his or her finger from the touchscreen. The amount of change due to this manner of rotating indicator 406 is dependent on how far through drag area 404 indicator 406 is moved by the user before de-selecting the indicator.

A second way to change the location of indicator 406 is to select drag area 404. Selection and de-selection of drag area 404 can be done in the same manner as selection and de-selection of indicator 406 (e.g., cursor/pointer and mouse or touchscreen). Indicator 406 is rotated in the direction of which portion of drag area 404 relative to indicator 406 is selected. For example, "clicking" in (or selection in alternate manners) a portion of drag area 404 in a clockwise direction from indicator 406 causes indicator 406 to rotate in a clockwise manner, while clicking in (or selection in alternate manners) a portion of drag area 404 in a counterclockwise direction from indicator 406 causes indicator 406 to rotate in a counterclockwise manner. The amount of change due to each selection of a portion of drag area 404 can be programmed by a user or application, as discussed in more detail below.

A third way to change the location of indicator 406 is to select either increment button 408 or decrement button 410. Selection and de-selection of buttons 408 and 410 can be done in the same manner as selection and de-selection of indicator 406 discussed above, except that no dragging occurs. Selection of increment button 408 causes indicator 406 to rotate in a clockwise manner, while selection of decrement button 410 causes indicator 406 to rotate in a counterclockwise manner. The amount of change due to each selection of a portion of drag area 404 can be programmed by a user or application, as discussed in more detail below.

The amount of physical change in location of indicator 406 within drag area 404 is dependent on the minimum and maximum values represented by control knob glyph 402 as well as the amount of change requested by the user. In one implementation, the change in current value with respect to the possible range (maximum—minimum) is the same as the change in location of indicator 406 with respect to drag area 404. For example, if the drag area is 180 degrees and the indicator is moved 9 degrees (i.e., indicator 406 is rotated 5% of the drag area 404), and if the range of values for the parameter is 100, then the value would be changed by 5 (i.e., 5% of the range).

Figure 4B:
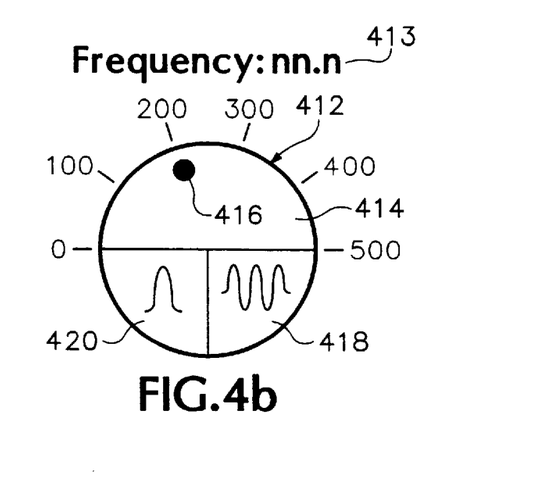

FIG. 4*b* illustrates a control knob glyph according to another embodiment of the present invention. As illustrated, a control knob glyph 412 has a drag area 414 through which a substantially circular dimple indicator 416 can be moved in a clockwise or counterclockwise manner. The current location of the center of indicator 416 within drag area 414 identifies the current value of the parameter being represented by control knob glyph 412. Moving indicator 416 in a counterclockwise manner decreases the current value being set by control knob glyph 412, while moving indicator 416 in a clockwise manner increases the current value. Analogous to control knob glyph 402 of FIG. 4*a*, control knob glyph 412 is separated into two portions, a first including drag area 414 and indicator 416, and a second including an increment button 418 and decrement button 420. Indicator 416 can be rotated through drag area 414 in any of numerous manners analogous to indicator 406 discussed above with reference to FIG. 4*a*.

According to one embodiment of the present invention, additional markings are provided by control knob manager 340 along the circumference of the control knob glyph corresponding to the portion including the drag area and the indicator. An example of such markings is illustrated in FIG. 4*b* with the hash marks and corresponding values of 0, 100, 200, 300, 400, and 500. Alternatively, the hash marks and corresponding values could be shown within control knob glyph 412 rather than external to knob glyph 412. According to another alternate embodiment, rather than providing hash marks and corresponding values, an additional value field which provides a numeric readout of the current value may be provided by control knob manager 340 external or internal to control knob glyph 412.

Additionally, according to one embodiment of the present invention, an additional textual or graphical label(s) can be added near the control knob glyph. Such a label could identify the particular parameter being controlled by the control knob glyph (e.g., label 403 of FIG. 4*a*), and alternatively may also provide a numeric indication of the current value of the parameter being controlled by the control knob glyph (e.g., label and value 413 of FIG. 4*b*).

Furthermore, according to one embodiment, the increment and decrement buttons of a control knob glyph in accordance with the present invention include different images to identify the effect of their selection. One example of such indications is the "−" and "+" signs of decrement and increment buttons 410 and 408 of FIG. 4a, respectively. Another example is waveforms of different frequency depictions for the increment and decrement buttons 418 and 420 of FIG. 4b. The waveform displayed on button 420 has a lower frequency than the waveform displayed on button 418, so selection of button 420 would reduce the current value (e.g., of the frequency currently being measured) while selection of button 418 would increase the value.

In the illustrated embodiment, control knob manager 340 of FIG. 3 alters the appearance of an indicator, button, or drag area when selected in order to provide visual feedback to the user of the selection. In one implementation, the change in appearance continues until the indicator, button, or drag area is de-selected. By way of example, the appearance of an indicator (e.g., indicator 406 of FIG. 4a or 416 of FIG. 4b) or a button (e.g., button 408 or 410 of FIG. 4a or button 418 or 420 of FIG. 4b) can be altered by lightening (e.g., whiting out), darkening (e.g., blacking out) the indicator or button, by outlining the indicator or button differently to make it look as if it were physically pressed in, etc.

Additionally, selection of a drag area (e.g., drag area 404 of FIG. 4a or drag area 414 of FIG. 4b) can be indicated to a user by changing the appearance of the drag area (e.g., lightening, darkening, outlining differently, etc.). In one implementation, where an indicator such as wedge indicator 406 of FIG. 4a can separate the drag area into two distinct sections (one to the clockwise direction of indicator 406 and another to the counterclockwise direction of indicator 406), the appearance of the entire drag area in that section is changed in response to any selection within that section of the drag area. However, where an indicator such as dimple indicator 416 of FIG. 4b does not separate the drag area into two distinct sections, an additional indication (e.g., another substantially circular dimple of a color different than either dimple indicator 416 or drag area 414) is displayed in the drag area at the position where the user selected.

In the illustrated embodiments of FIGS. 4a and 4b, the portions including the drag area and indicator are substantially half-circles, while the portions including the increment and decrement buttons are also substantially half-circles. In alternate embodiments, the size of such portions is altered. By way of example, the portion including the drag area and the indicator can be made to be greater than a half-circle or less than a half-circle.

Figure 4C:
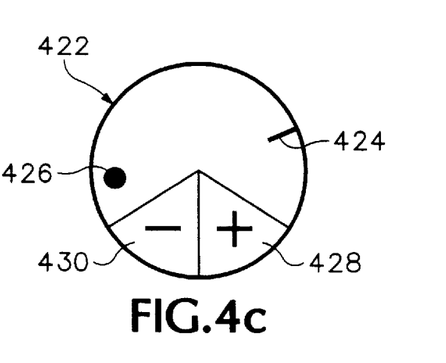

FIG. 4c illustrates a control knob glyph according to another embodiment of the present invention. As illustrated, control knob glyph 422 includes a drag area 424 through which a substantially circular dimple indicator 426 can be moved in a clockwise or counterclockwise manner. The current location of indicator 426 within drag area 424 identifies the current value of the parameter being represented by control knob glyph 422. Control knob glyph 422 is similar to control knob glyph 412 of FIG. 4b, except that the portion including increment button 428 and decrement button 430 is smaller than the corresponding portion of control knob glyph 412.

Figure 4D:
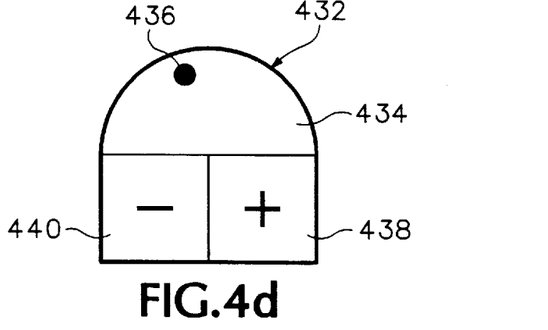

It is also to be appreciated that although the portion including the drag area and indicator of a control knob glyph is partially circular in order to maintain the intuitive clockwise vs. counterclockwise mapping to increasing value vs. decreasing value, the portion including the increment and decrement buttons can be other geometric shapes such as rectangular, triangular, etc. FIG. 4d illustrates a control knob glyph incorporating such different shapes according to one embodiment of the present invention. As illustrated, control knob glyph 432 includes a drag area 434 through which a substantially circular dimple indicator 436 can be moved in a clockwise or counterclockwise manner. The current location of indicator 436 within drag area 434 identifies the current value being set by control knob glyph 432. Control knob glyph 432 is similar to control knob glyph 412 of FIG. 4b, except that the portion including increment button 438 and decrement button 440 is substantially rectangular rather than partially circular.

Figure 4E:
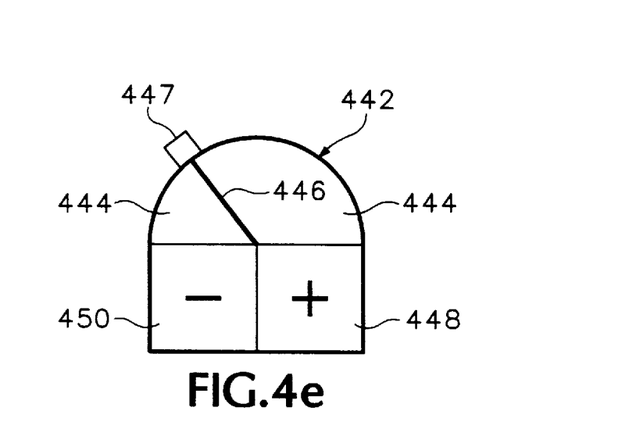

FIG. 4e illustrates a control knob glyph according to another embodiment of the present invention. As illustrated, control knob glyph 442 includes a drag area 444 through which an indicator line 446 can be moved in a clockwise or counterclockwise manner. The current location of indicator 446 within drag area 444 identifies the current value of the parameter being represented by control knob glyph 442. Increment button 448 and decrement button 450 can also be used to change the location of indicator 446. Additionally, as illustrated a handle 447 which can be rotated along the circumference drag area 444 may also be provided as part of glyph 442. Handle 447 can be selected and rotated along the edge of drag area 444 in a manner analogous to that of indicator 446. Handle 447 can be provided in addition to indicator 446, or alternatively indicator 446 need not be included.

Thus, as can be seen in FIGS. 4a–4e, the drag area and indicator comprise a partially circular area. This partially circular area can be a semicircle (a 180 degree partially circular area), as illustrated in FIGS. 4a and 4b, or alternatively can include a number of degrees greater or less than 180, such as illustrated in FIG. 4c.

According to one embodiment of the present invention, control knob manager 340 also provides an "autorepeat" feature for the control knob glyph. In this embodiment, continued selection of a button or drag area (e.g., continuous touching of a button or drag area with a finger, or continuous depression of a mouse button while a cursor is "over" a button or drag area) causes control knob manager 340 to continually move the indicator (the direction of movement being dependent on which button or which portion of the drag area is selected). For example, while the increment button is continually selected, control manager 340 may update the location of the indicator by the value assigned to the increment button every 500 milliseconds (ms).

Additionally, according to one embodiment of the present invention, value changes accelerate over time as a button or drag area is continuously selected (for example, as a button or drag area is continually touched via a touchscreen, or as a mouse button is continually depressed while a pointer is over the button or drag area). When a button or drag area is continuously selected, the current value is increased by a particular change amount upon initial selection. After a first period of time (e.g., 500 ms), the current value begins to "scroll" by the change amount. That is, the current value is updated after 500 ms and then is updated by the change amount after each successive second period of time (e.g., 100 ms). Additionally, each successive second period of time (or alternatively every third, fourth, etc. period) the change amount by which the value is scrolled is incremented by an acceleration value.

By way of example, assume that the current value for a parameter is 50, that the control knob glyph is programmed to change by a value of 5 when the drag area is selected, and that the acceleration value is 2 times the change value, which in this example would be 10 (2*5). If a user presses and holds down in the drag area to the right (e.g., clockwise) of the indicator, then the current value is increased to 55 upon initial selection of the drag area. After 500 ms, the current value is increased by 5 to 60. After another 100 ms, acceleration begins so that the change value is incremented by the acceleration value, then added to the current value, resulting in a value of 75 (5+10+60) after 600 ms from initial selection of the drag area. After another 100 ms, the change value is accelerated again (by 10) and added to the previous change value (which was 15), resulting in a current value of 100 after 700 ms from initial selection of the drag area. It can be seen that subsequent current values according to this example will be 135 after 800 ms, 180 after 900 ms, 235 after 1 second, 300 after 1.1 seconds, etc. Thus, it can be seen that by using the "acceleration" feature of the present invention, a user is able to increase or accelerate the amount of change by continually selecting a button or drag area, thereby allowing larger changes to be made more quickly.

Various properties of the control knob glyph of the present invention are programmable. These properties can be programmed by a particular application, such as one of applications 330 of FIG. 3. Table I illustrates the programmable properties according to one embodiment of the present invention.

TABLE I

| Property | Description |
| --- | --- |
| Control Value | The current value of the parameter being represented by the control knob glyph. The Control Value is initially passed in from an application and can be modified by user actions with the control knob glyph. |
| Slider Size | Sets the percentage of the top semicircle which will be consumed by the wedge or dimple indicator. Should be large enough to be easily captured by the user's finger or cursor/pointer. |
| Flash Color | Color of the drag area for a brief period of time following a selection of that area to indicate to the user that a selection of that area has occurred. |
| Large Increment | Amount by which the Control Value is changed when the drag area is selected. |
| Small Increment | Amount by which the Control Value is changed when the increment or decrement button is selected. In one implementation this amount is less than the amount by which the control value is changed when the drag area is selected. |
| Increment Picture | Image shown on the increment button to indicate what will happen when the button is pressed or the indicator is moved in the clockwise direction. In one implementation the image is a bitmap. |
| Decrement Picture | Image shown on the decrement button to indicate what will happen when the button is pressed or the indicator is moved in the counterclockwise direction. In one implementation the image is a bitmap. |
| Acceleration | Amount by which the increment/decrement action is accelerated when the increment button or decrement button or drag area is continuously selected. |
| Debounce Value | Minimum amount of movement of the indicator which is registered as a change to the Control Value. |
| Minimum Value | The smallest Control Value that the parameter can have. |
| Maximum Value | The largest Control Value that the parameter can have. |

According to one embodiment of the present invention, different parameters can be multiplexed onto a single control knob glyph. In this embodiment, control knob manager 340 of FIG. 3 maintains a set of properties for the current parameter being represented by the control knob glyph. When an application desires to change which parameter is being represented by the control knob glyph (e.g., in response to such a request by a user), the properties for the new parameter are provided to control knob manager 340. In response, control knob manager 340 updates its set of properties with the newly received properties for the new parameter. Thus, a user is able to dynamically change which parameter is being represented by the control knob glyph during operation of the measurement instrument.

Changes in parameters can be requested by a user in any of a wide variety of conventional manners. For example, a user may be able to select parameters from a drop-down menu, type in parameters in a command field, etc.

According to one embodiment of the present invention, control knob manager 340 also attempts to correct for "bounce" situations. A bounce situation refers to the situation where, due to finger placement (for a touchscreen) or cursor/pointer placement, very slight movements of the user's finger or the cursor/pointer indicate a change in value, so that it is easy for a user to unintentionally indicate frequent changes in position. For example, when using a touchscreen, if the user touches the wedge indicator 406 of FIG. 4a, then it is possible that the slight unintentional movement of the user's finger to the right is interpreted as a clockwise drag input, after which the slight unintentional movement of the user's finger to the left is interpreted as a counterclockwise drag input. This process can continue, causing the indicator to "bounce" back and forth between two or more values.

In the illustrated embodiment, the present invention corrects such bounce situations by establishing a minimum amount by which the indicator, when selected, must be rotated through the drag area before it is interpreted by control knob manager 340 as a change in value for the parameter. This minimum amount is identified as the "debounce value" in Table I above. In the illustrated embodiment, the debounce value represents an angular change (in degrees) that must be made by a user in selecting and rotating the indicator before it is interpreted as an actual change in value (for example, five degrees). Any change in location of the indicator by selecting the indicator and rotating it less than the debounce value is ignored by control knob manager 340. Thus, by ignoring such "small" changes (i.e., less than the debounce value), the control knob manager can reduce the potential "bouncing" of the indicator.

Alternatively, the present invention can detect "bounce" situations by looking for direction changes (that is, a change from increment to decrement or from decrement to increment). Any such direction change is initially ignored by the control knob manager and no change to the value or the indicator is made. However, if another change input in the same direction is received within a period of time (e.g., within 0.25 seconds), then the control knob manager assumes that it is an intentional movement in that direction and begins movement in the requested direction. Thus, by delaying the decision of whether to update the current value, the control knob manager can reduce the potential "bouncing" of the indicator.

Figure 5:
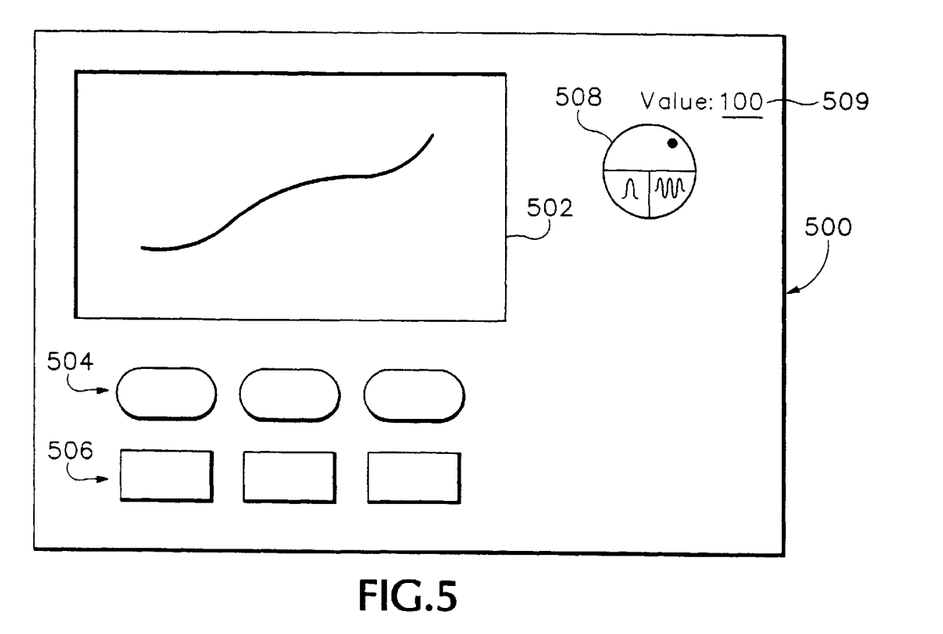
FIG. 5 illustrates an exemplary screen incorporating one embodiment of the present invention.

FIG. 5 illustrates an exemplary screen incorporating one embodiment of the present invention. The screen 500 provides a display of a measurement instrument, including a display area 502 where measurement data is presented graphically. Various control buttons 504 and input fields 506 are also presented to provide additional control of the measurement instrument.

In the illustrated example of FIG. 5, a control knob glyph 508 is also illustrated. According to one implementation, control knob manager 340 also provides an alphanumeric indication of the parameter being controlled as well as the current value, as illustrated by indication 509. This indication (e.g., label) and current value could be provided to control knob manager 340 as programmable properties in addition to those illustrated in Table I above. Alternatively, such indications may not be given, or may be provided by the software application controlling the display of screen 500.

Figure 6:
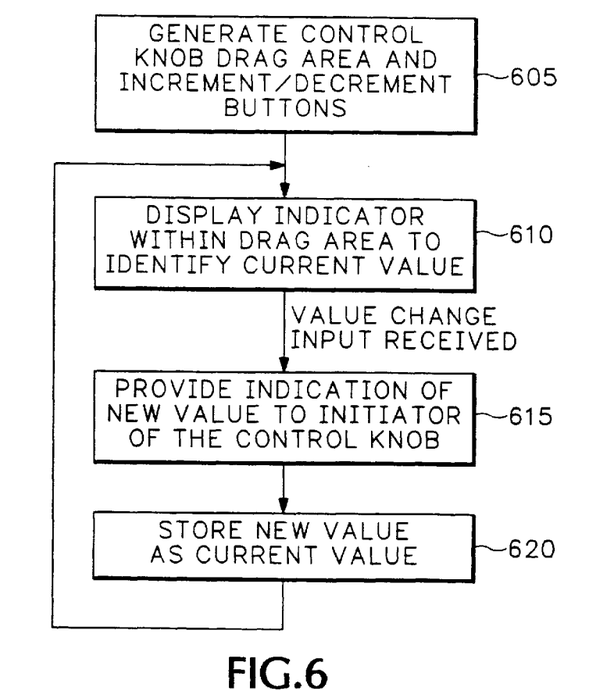
FIG. 6 is a flowchart illustrating the steps followed in facilitating user interaction with a measurement instrument according to one embodiment of the present invention.

FIG. 6 is a flowchart illustrating the steps followed using a control knob glyph to facilitate user interaction with a measurement instrument according to one embodiment of the present invention. As illustrated, the control knob manager generates the control knob glyph drag area and increment/decrement buttons, step 605, and displays the indicator to identify the current value being represented by the control knob glyph, step 610. The indicator remains unchanged until a value change input is received by the control knob manager. The value change input of a user can be received in any of a wide variety of manners, as discussed above, such as by selecting the indicator, selecting a button, etc. Upon receipt of a value change, the control knob manager provides an indication of the new value to the application which initiated the control knob glyph (e.g., a measurement application), step 615. This indication allows that application to update the appropriate measurement setting, display setting, etc. indicated by the user. The control knob manager then stores the new value as the current value, step 620, and proceeds to display the indicator to identify the updated current value, step 610.

Figure 7:
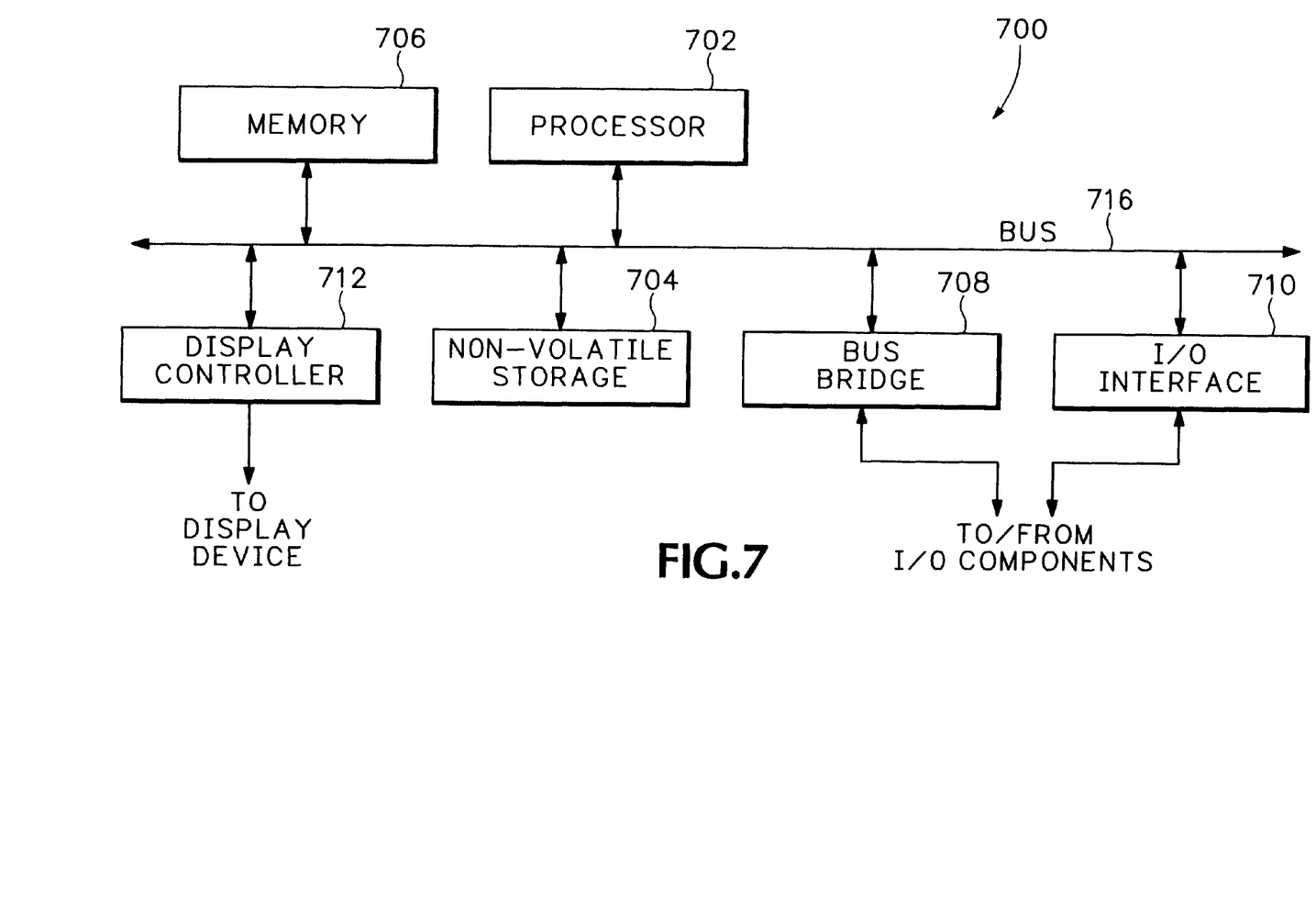
FIG. 7 illustrates a hardware system or machine on which the one embodiment of the present invention can be implemented.

FIG. 7 illustrates a hardware system or machine on which the control knob manager 340 of FIG. 3 can be implemented according to one embodiment of the present invention. As illustrated, a system 700 includes a processor 702, non-volatile storage 704, memory 706, bus bridge 708, an input/output (I/O) interface 710, display controller 712, coupled to each other through internal bus 716. According to one implementation, display controller 712 communicates with display device 230 of FIG. 2. Bus bridge 708 is also coupled to measurement subsystem 220 to facilitate provision of programming selections to and receipt of responses from measurement subsystem 220. I/O interface 710 provides a coupling to various other I/O devices, such as other storage devices, cursor control devices, network connections, etc. According to one implementation, I/O interface 710 provides a coupling to input devices 240 of FIG. 2. In one embodiment, internal bus 716 is a peripheral component interconnect (PCI) bus, whereas bus bridge 708 is a PCI to a PCI bridge. Elements 702–716 are all intended to represent a broad category of these elements known in the art. Each of the elements 702–716 performs its conventional functions known in the art, and their constitutions are well-known. Accordingly, elements 702–716 will not be discussed further.

In one embodiment, control knob manager 340 discussed above is implemented as a series of software routines run by hardware system 700 of FIG. 7. These software routines comprise a plurality or series of instructions to be executed by a processor in a hardware system. Initially, the series of instructions are stored on a storage device, such as non-volatile storage 704. The instructions are copied from non-volatile storage 704 into memory 706 and then accessed and executed by processor 702. In one implementation, these software routines are written in the C++ programming language. It is to be appreciated, however, that these routines may be implemented in any of a wide variety of programming languages. In alternate embodiments, the present invention is implemented in discrete hardware or firmware. By way of example, an application specific integrated circuit (ASIC) may be programmed to implement the functions of control knob manager 340 discussed above.

In the discussions above, various examples are given using specific values (such as particular periods of time). It is to be appreciated that such values are given as examples only, and that alternate embodiments of the present invention can use different values.

In the discussions above, reference is made to clockwise rotation of the indicator of the control knob glyph increasing the current value being represented by the control knob glyph, while counterclockwise rotation decreases the current value. In an alternate embodiment these rotations are reversed so that clockwise rotation decreases the value while counterclockwise rotation increases the value, such reversal being dependent on the intuitiveness of clockwise vs. counterclockwise rotation to the particular parameter being changed.

Thus, the present invention advantageously facilitates user interaction with a measurement instrument by providing a control knob glyph that incorporates the intuitive clockwise vs. counterclockwise mapping to increasing value vs. decreasing value. Thus, users are able to interact with the measurement instrument using a control knob glyph having the intuitive clockwise and counterclockwise mappings to which they are accustomed.

Thus, a method and apparatus for facilitating user interaction with a measurement instrument using a display-based control knob has been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

What is claimed is:

1. A method for facilitating user interaction with a measurement instrument comprising the steps of:
    displaying a control knob glyph corresponding to a user-adjustable parameter of the measurement instrument, the control glyph having both an indicator and a partially circular drag area through which the indicator can be rotated in both a clockwise and a counterclockwise manner as a first portion of the control knob glyph and both an increment and a decrement button as a second portion of the control knob glyph;
    receiving an input indicating an amount of rotational movement for the indicator; and
    changing the location of the indicator within the partially circular drag area and a value of the parameter in response to the input.

2. A method for facilitating user interaction with a measurement instrument comprising the steps of:
    displaying a control knob glyph corresponding to a user-adjustable parameter of the measurement instrument, the control knob glyph having an indicator and a partially circular drag area through which the indicator can be rotated in both a clockwise and a counterclockwise manner;
    receiving an input indicating an amount of rotational movement for the indicator;
    changing the location of the indicator within the drag area and a value of the parameter in response to the input if the desired change is greater than a particular value.

3. The method of claims 1 or 2, wherein the indicator comprises a substantially triangular wedge.

4. The method of claims 1 or 2, wherein the indicator comprises a substantially circular dimple.

5. The method of claim 1, wherein the receiving of the input includes receiving an indication as to whether the indicator was selected, the drag area was selected, or one of the buttons of the second portion was selected.

6. The method of claim 5, further comprising changing the location of the identifier within the drag area by a first amount if the portion of the drag area was selected and by a second amount if one of the buttons of the second portion was selected, wherein the first amount is greater than the second amount.

7. The method of claim 1, further comprising:
updating a location of the indicator by a change amount in response to continued selection of either the drag area or one of the buttons of the second portion; and
accelerating the change amount in response to either the drag area or one of the buttons of the second portion being selected for greater than a threshold period of time.

8. The method of claims 1 or 2, further comprising displaying a label associated with the control knob glyph to indicate to a user a current parameter being represented by the control knob glyph and the value of the parameter.

9. A machine-readable medium having stored thereon a series of instructions which, when executed by a processor of a measurement instrument, facilitate user interaction with the measurement instrument by causing the processor to:
display a control glyph corresponding to a user-adjustable parameter of the measurement instrument, the control knob glyph having both an indicator and a partially circular drag area through which the indicator can be rotated in both a clockwise and a counterclockwise manner as a first portion of the control knob glyph and both an increment and a decrement button as a second portion of the control knob glyph;
receive an input indicating an amount of rotational movement for the indicator; and
change the location of the indicator within the drag area and a value of the parameter in response to the input.

10. The machine-readable medium of claim 9, further comprising instructions which, when executed by the processor, cause the processor to accelerate a change in the location of the indicator in response to either the drag area or one of the buttons of the second portion being selected for greater than a threshold period of time.

11. The machine-readable medium of claim 9, wherein the receiving of the input includes receiving an indication as to whether the indicator was selected, the drag area was selected, or one of the buttons of the second portion was selected.

12. The machine-readable medium of claim 11, further comprising instructions which, when executed by the processor, cause the processor to change the location of the indicator within the drag area by a first amount if the portion of the drag area was selected and by a second amount if one of the buttons of the second portion was selected, wherein the first amount is greater than the second amount.

13. A measurement apparatus comprising:
a display device; and
a control subsystem coupled to the display device to
provide a control knob glyph on the display device corresponding to a user-adjustable parameter of the measurement apparatus, the control knob glyph having both an indicator and a partially circular drag area through which the indicator can be rotated in both a clockwise and a counterclockwise manner as a first portion of the control knob glyph and both an increment and a decrement button as a second portion of the control knob glyph,
receive an input indicating an amount of rotational movement for the indicator, and
change the location of the indicator within the drag area and a value of the parameter in response to the input.

14. The measurement apparatus of claim 13, wherein the control subsystem is further to accelerate a change in the location of the indicator in response to either the drag area or one of the buttons of the second portion being selected for greater than a threshold period of time.

15. The measurement apparatus of claim 13, wherein the increment button and the decrement button each include an image to indicate to a user the result of selection of one of the increment or decrement buttons.

16. The measurement apparatus of claim 13, wherein the receiving of the input includes receiving an indication as to whether the indicator was selected, the drag area was selected, or one of the buttons of the second portion was selected.

17. The measurement apparatus of claim 16, wherein the control subsystem is further to change the location of the identifier within the drag area by a first amount if the portion of the drag area was selected and by a second amount if one of the buttons of the second portion was selected, wherein the first amount is greater than the second amount.

\* \* \* \* \*